US012604716B2

(12) United States Patent
Xie et al.

(10) Patent No.: US 12,604,716 B2
(45) Date of Patent: Apr. 14, 2026

(54) INTERCONNECT WITH TWO-DIMENSIONAL FREE ZERO LINE END ENCLOSURE

(71) Applicant: International Business Machines Corporation, Armonk, NY (US)

(72) Inventors: Ruilong Xie, Niskayuna, NY (US); Albert M. Chu, Nashua, NH (US); Nicholas Anthony Lanzillo, Wynantskill, NY (US); Lawrence A. Clevenger, Saratoga Springs, NY (US); Huai Huang, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 768 days.

(21) Appl. No.: 17/808,316

(22) Filed: Jun. 23, 2022

(65) Prior Publication Data

US 2023/0420296 A1    Dec. 28, 2023

(51) Int. Cl.
*H01L 21/768* (2006.01)
*H01L 23/522* (2006.01)
*H01L 23/528* (2006.01)

(52) U.S. Cl.
CPC .... *H01L 21/76897* (2013.01); *H01L 23/5227* (2013.01); *H01L 23/5283* (2013.01)

(58) Field of Classification Search
CPC ........... H01L 21/76897; H01L 23/5227; H01L 23/5283
USPC ........................................................ 257/443
See application file for complete search history.

(56) References Cited

U.S. PATENT DOCUMENTS

| | | | |
|---|---|---|---|
| 4,400,257 A | 8/1983 | Taylor | |
| 9,324,650 B2 | 4/2016 | Edelstein et al. | |
| 9,735,029 B1 | 8/2017 | Chu et al. | |
| 9,966,337 B1 | 5/2018 | Briggs et al. | |
| 10,177,028 B1 | 1/2019 | Licausi et al. | |
| 10,903,239 B2 | 1/2021 | Chang et al. | |
| 2004/0053501 A1* | 3/2004 | Brennan | H01L 23/5226 257/E23.145 |
| 2016/0056104 A1 | 2/2016 | Bouche et al. | |
| 2017/0140986 A1 | 5/2017 | Machkaoutsan et al. | |
| 2018/0096932 A1 | 4/2018 | Xie et al. | |
| 2018/0315654 A1 | 11/2018 | Briggs et al. | |
| 2021/0305155 A1 | 9/2021 | Bao et al. | |
| 2022/0020634 A1 | 1/2022 | Xie et al. | |

OTHER PUBLICATIONS

Shibata, "A novel zero-overlap/enclosure metal interconnection technology for high density logic VLSIs," Seventh International IEEE Conference on VLSI Multilevel Interconnection, Jun. 1990, 7p.

* cited by examiner

*Primary Examiner* — Tu-Tu V Ho
(74) *Attorney, Agent, or Firm* — CANTOR COLBURN LLP; Samuel Waldbaum

(57) ABSTRACT

Embodiments of the invention include providing interconnects with two-dimensional free zero line end enclosure. A first metal line is formed. A second metal line is connected by a via to the first metal line, the first metal line having a first end with a zero line extension in relation to the via in a first dimension, the second metal line having another first end with a zero line extension in relation to the via in a second dimension perpendicular to the first dimension.

18 Claims, 14 Drawing Sheets

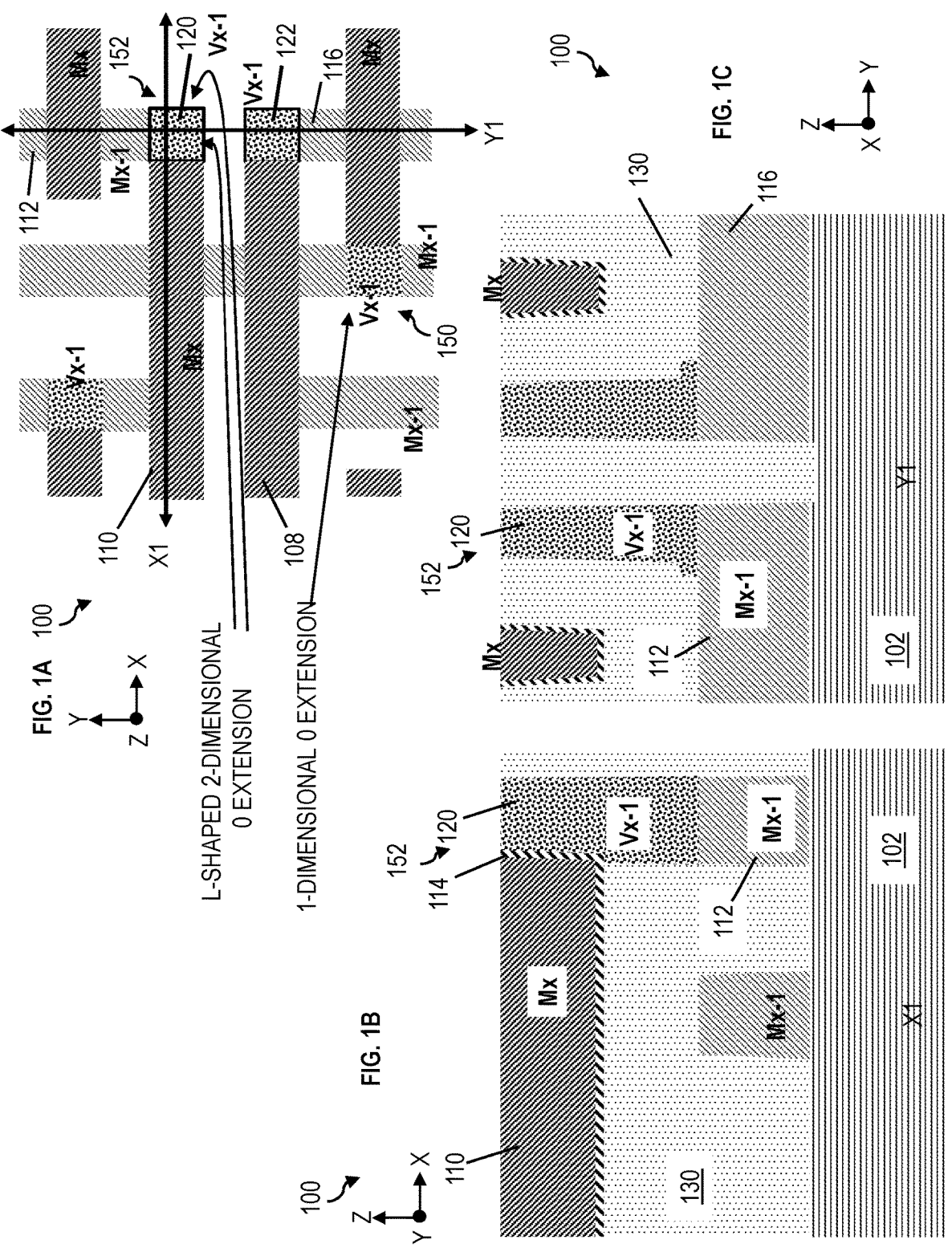

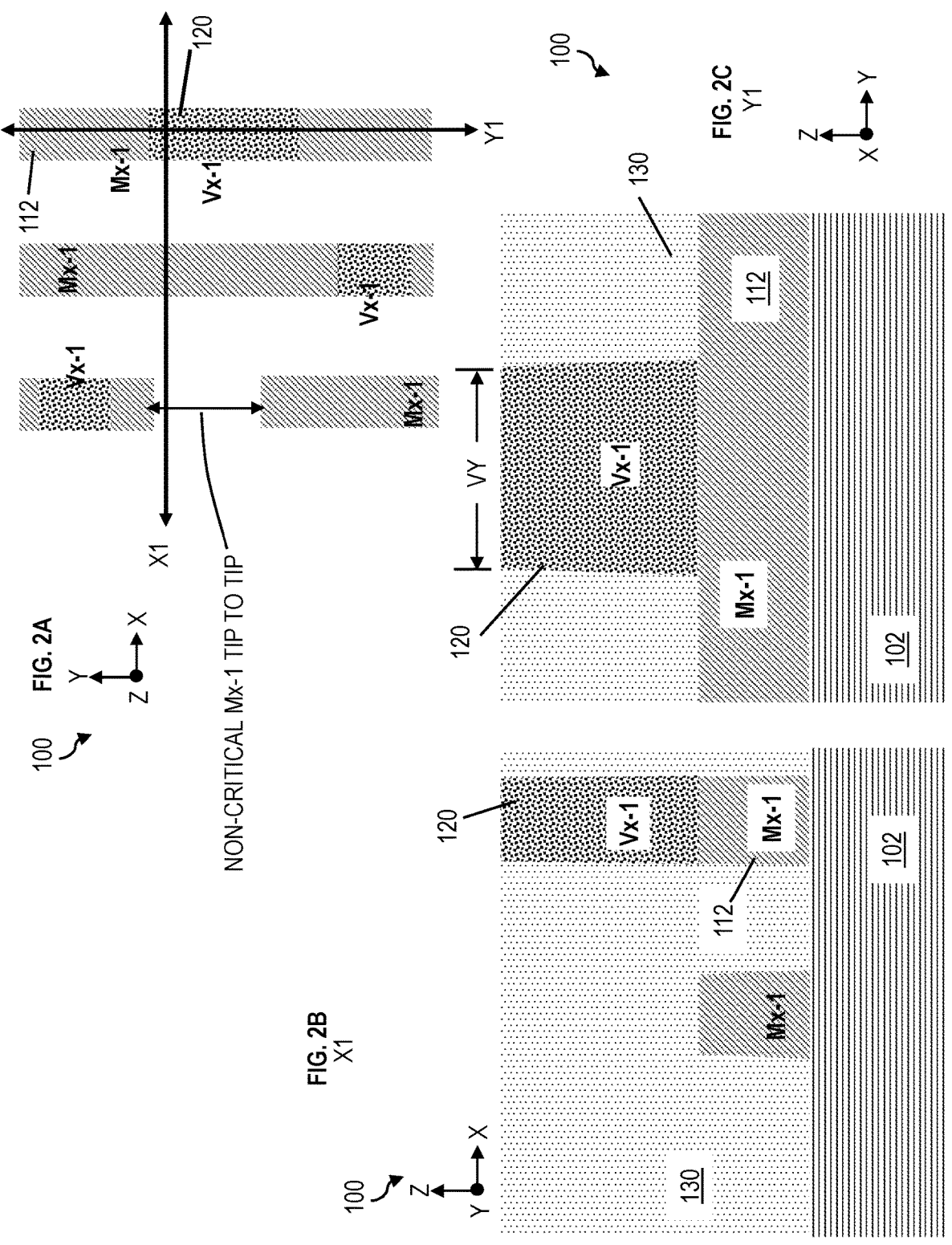

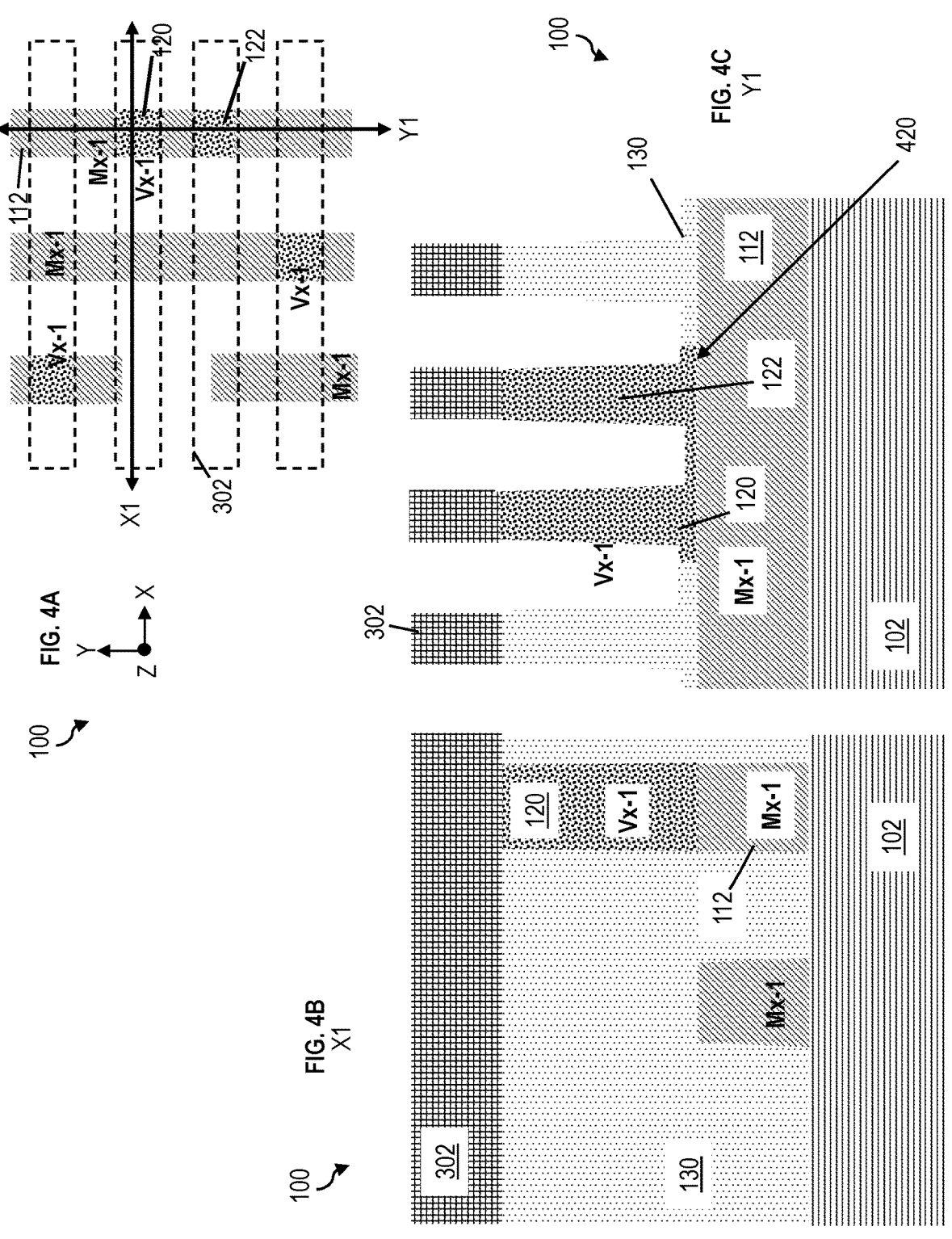

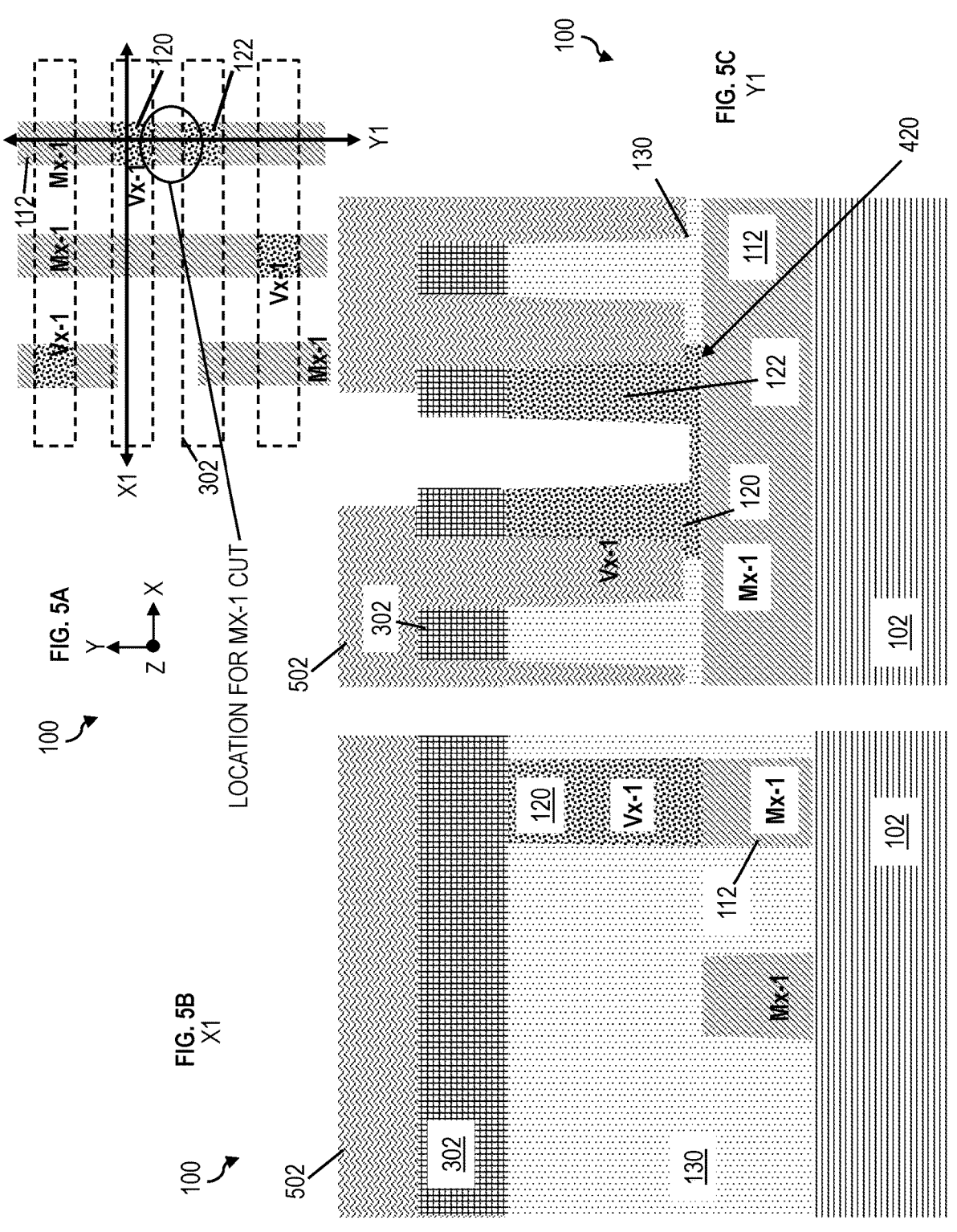

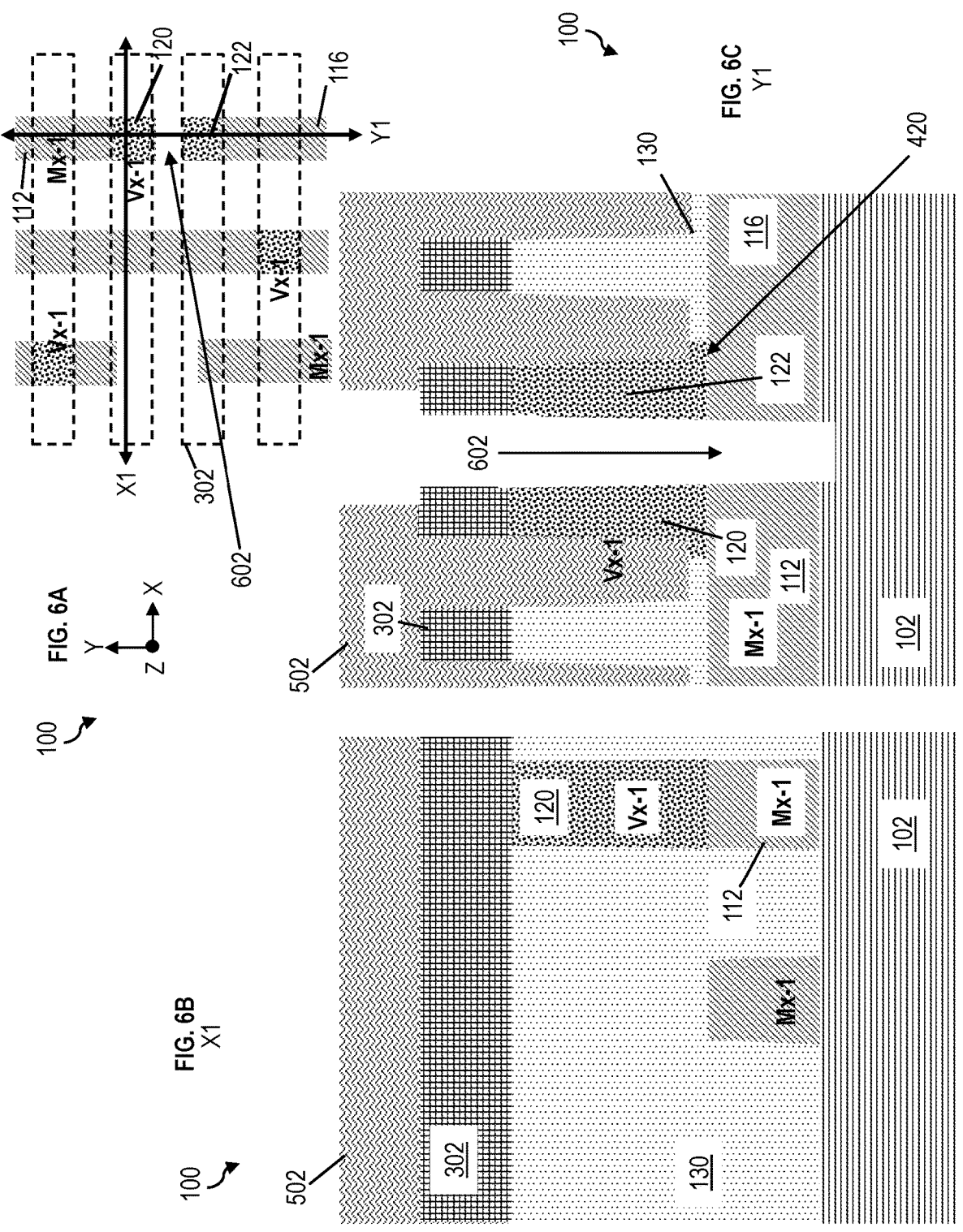

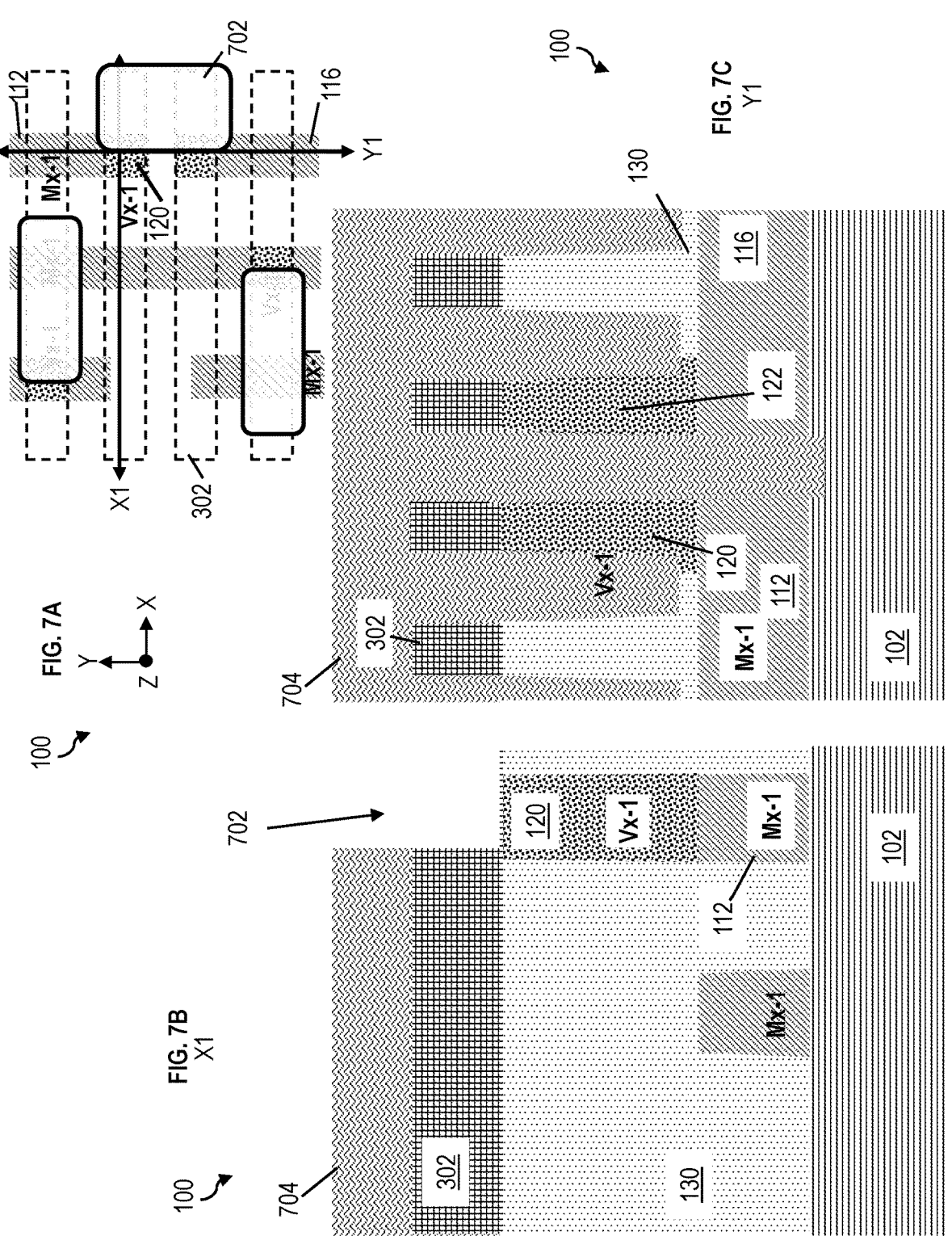

X1

Y1

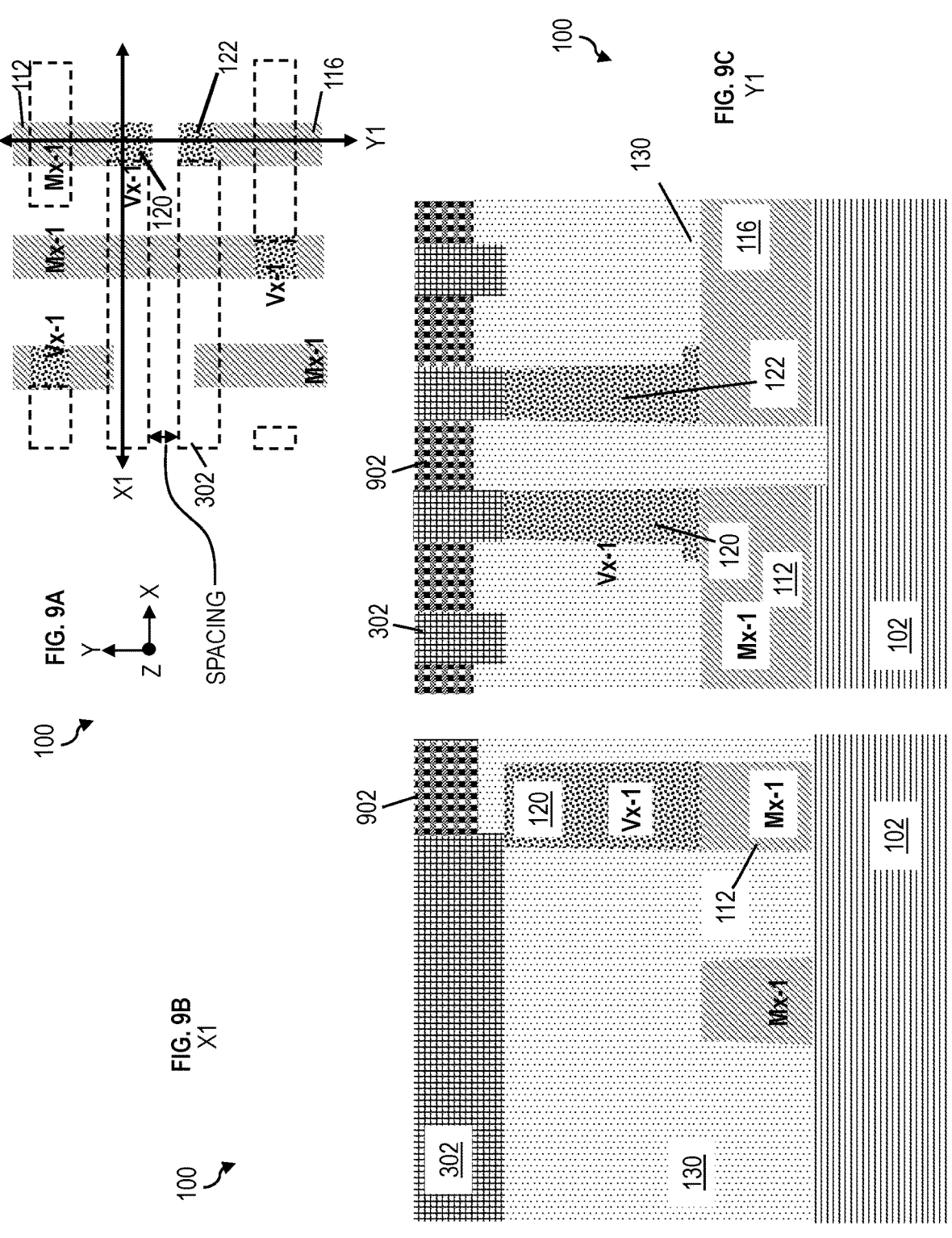

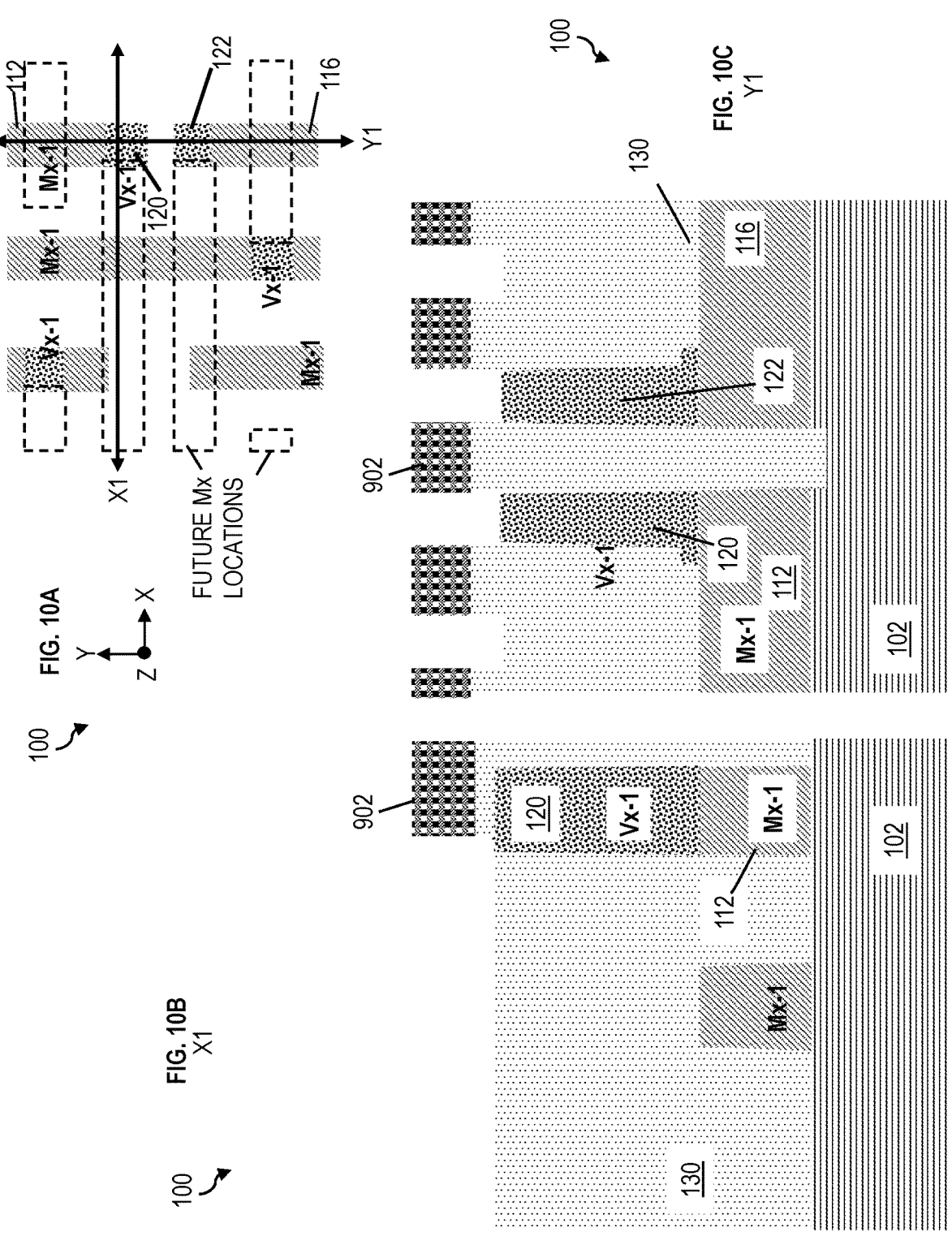

X1

Y1

1300

FORM A FIRST METAL LINE
1302

FORM A SECOND METAL LINE CONNECTED BY A VIA TO THE FIRST METAL LINE, THE FIRST METAL LINE HAVING A FIRST END WITH A ZERO LINE EXTENSION IN RELATION TO THE VIA IN A FIRST DIMENSION, THE SECOND METAL LINE HAVING ANOTHER FIRST END WITH A ZERO LINE EXTENSION IN RELATION TO THE VIA IN A SECOND DIMENSION PERPENDICULAR TO THE FIRST DIMENSION    1304

FIG. 14  1400

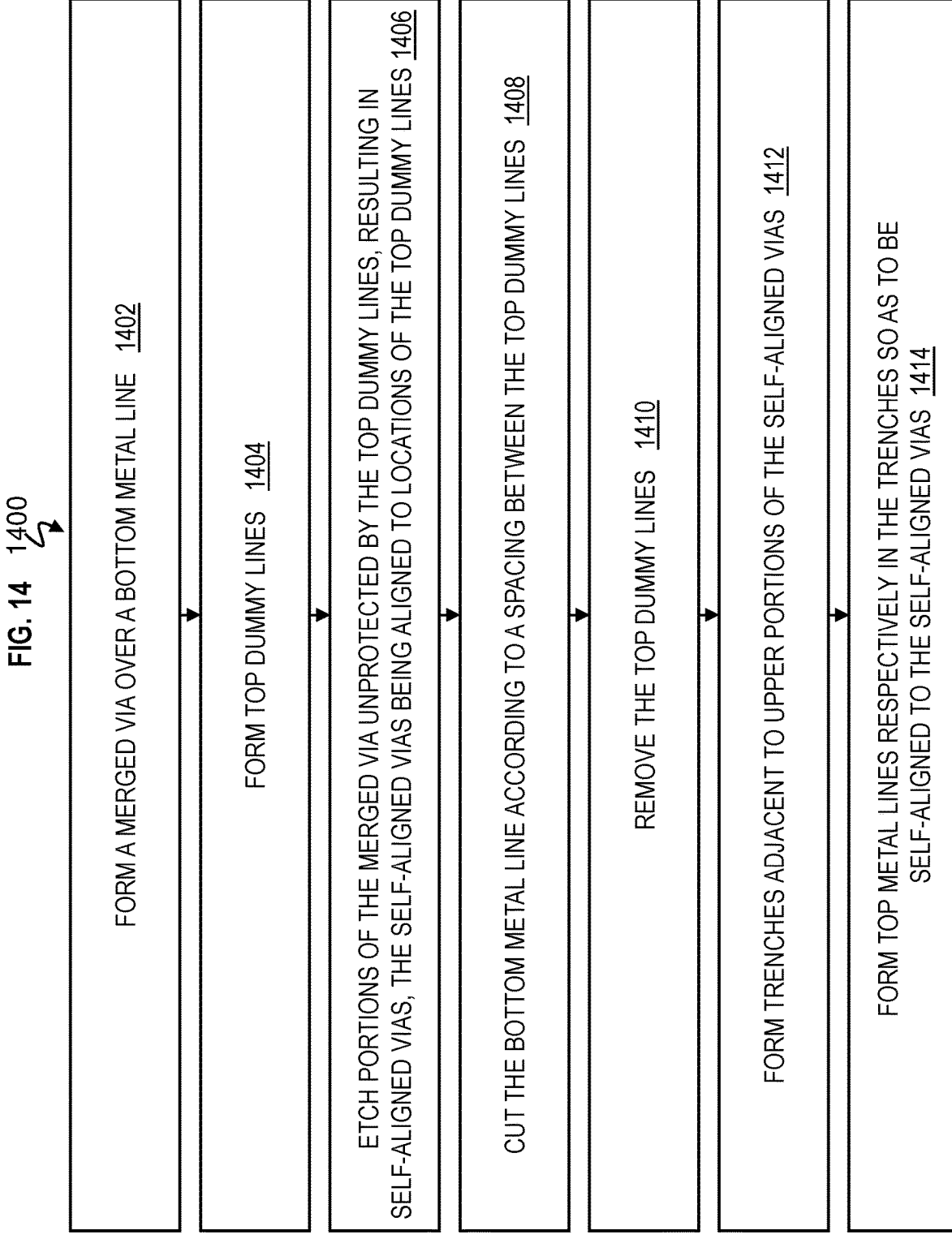

FORM A MERGED VIA OVER A BOTTOM METAL LINE   1402

FORM TOP DUMMY LINES   1404

ETCH PORTIONS OF THE MERGED VIA UNPROTECTED BY THE TOP DUMMY LINES, RESULTING IN SELF-ALIGNED VIAS, THE SELF-ALIGNED VIAS BEING ALIGNED TO LOCATIONS OF THE TOP DUMMY LINES   1406

CUT THE BOTTOM METAL LINE ACCORDING TO A SPACING BETWEEN THE TOP DUMMY LINES   1408

REMOVE THE TOP DUMMY LINES   1410

FORM TRENCHES ADJACENT TO UPPER PORTIONS OF THE SELF-ALIGNED VIAS   1412

FORM TOP METAL LINES RESPECTIVELY IN THE TRENCHES SO AS TO BE SELF-ALIGNED TO THE SELF-ALIGNED VIAS   1414

INTERCONNECT WITH TWO-DIMENSIONAL FREE ZERO LINE END ENCLOSURE

BACKGROUND

The present invention generally relates to fabrication methods and resulting structures for integrated circuits (ICs), and more specifically, to fabrication methods and resulting structures configured and arranged to provide interconnects with two-dimensional free zero line end enclosure.

ICs (also referred to as a chip or a microchip) include electronic circuits on a wafer. The wafer is a semiconductor material, such as, for example, silicon or other materials. An IC is formed of a large number of devices on the wafer. Typical ICs are formed by first fabricating individual semiconductor devices using processes referred to generally as the front-end-of-line (FEOL). Thereafter, the back-end-of-line (BEOL) is the second portion of IC fabrication where wiring of the IC is formed. The individual devices, such as transistors, capacitors, resistors, etc., are formed in earlier layers of the IC and interconnected with wiring in the BEOL layers of the wafer. The BEOL layer that includes the interconnection of wiring is referred to as the metallization layer, which generally begins when the first layer of metal is deposited on the wafer. BEOL layers of the IC generally include contacts, insulating layers (dielectrics), metal levels, bonding sites for chip-to-package connections, etc. ICs typically have interconnect levels, each level consisting of metallic lines and vias.

SUMMARY

Embodiments of the present invention are directed to providing interconnects with two-dimensional free zero line end enclosure. A non-limiting device includes an interconnect structure having a first metal line. A second metal line connected by a via to the first metal line. The first metal line has a first end with a zero line extension in relation to the via in a first dimension. The second metal line has another first end with a zero line extension in relation to the via in a second dimension perpendicular to the first dimension.

Embodiments of the present invention are directed to a method that includes forming a merged via over a bottom metal line, forming top dummy lines, and etching portions of the merged via unprotected by the top dummy lines, resulting in self-aligned vias, the self-aligned vias being aligned to locations of the top dummy lines. The method includes cutting the bottom metal line according to a spacing between the top dummy lines, removing the top dummy lines, the trenches being formed in dielectric material, and forming trenches adjacent to upper portions of the self-aligned vias. Top metal lines are formed respectively in the trenches so as to be self-aligned to the self-aligned vias.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a top view of a simplified illustration of a portion of an integrated circuit (IC) according to embodiments of the invention;

FIGS. 1B and 1C depict cross-sectional views of a portion of an IC under-fabrication after fabrication operations according to one or more embodiments of the invention;

FIGS. 2A, 2B, and 2C respectively depict a top view and cross-sectional views of a portion of an IC under-fabrication after fabrication operations according to one or more embodiments of the invention;

FIGS. 4A, 4B, and 4C respectively depict a top view and cross-sectional views of a portion of an IC under-fabrication after fabrication operations according to one or more embodiments of the invention;

FIGS. 5A, 5B, and 5C respectively depict a top view and cross-sectional views of a portion of an IC under-fabrication after fabrication operations according to one or more embodiments of the invention;

FIGS. 6A, 6B, and 6C respectively depict a top view and cross-sectional views of a portion of an IC under-fabrication after fabrication operations according to one or more embodiments of the invention;

FIGS. 7A, 7B, and 7C respectively depict a top view and cross-sectional views of a portion of an IC under-fabrication after fabrication operations according to one or more embodiments of the invention;

FIGS. 9A, 9B, and 9C respectively depict a top view and cross-sectional views of a portion of an IC under-fabrication after fabrication operations according to one or more embodiments of the invention;

FIGS. 10A, 10B, and 10C respectively depict a top view and cross-sectional views of a portion of an IC under-fabrication after fabrication operations according to one or more embodiments of the invention;

FIG. 14 is a flowchart of a computer-implemented method of forming interconnects with two-dimensional free zero line end enclosure according to one or more embodiments of the invention.

DETAILED DESCRIPTION

Figures 3A, 3B, 3C:
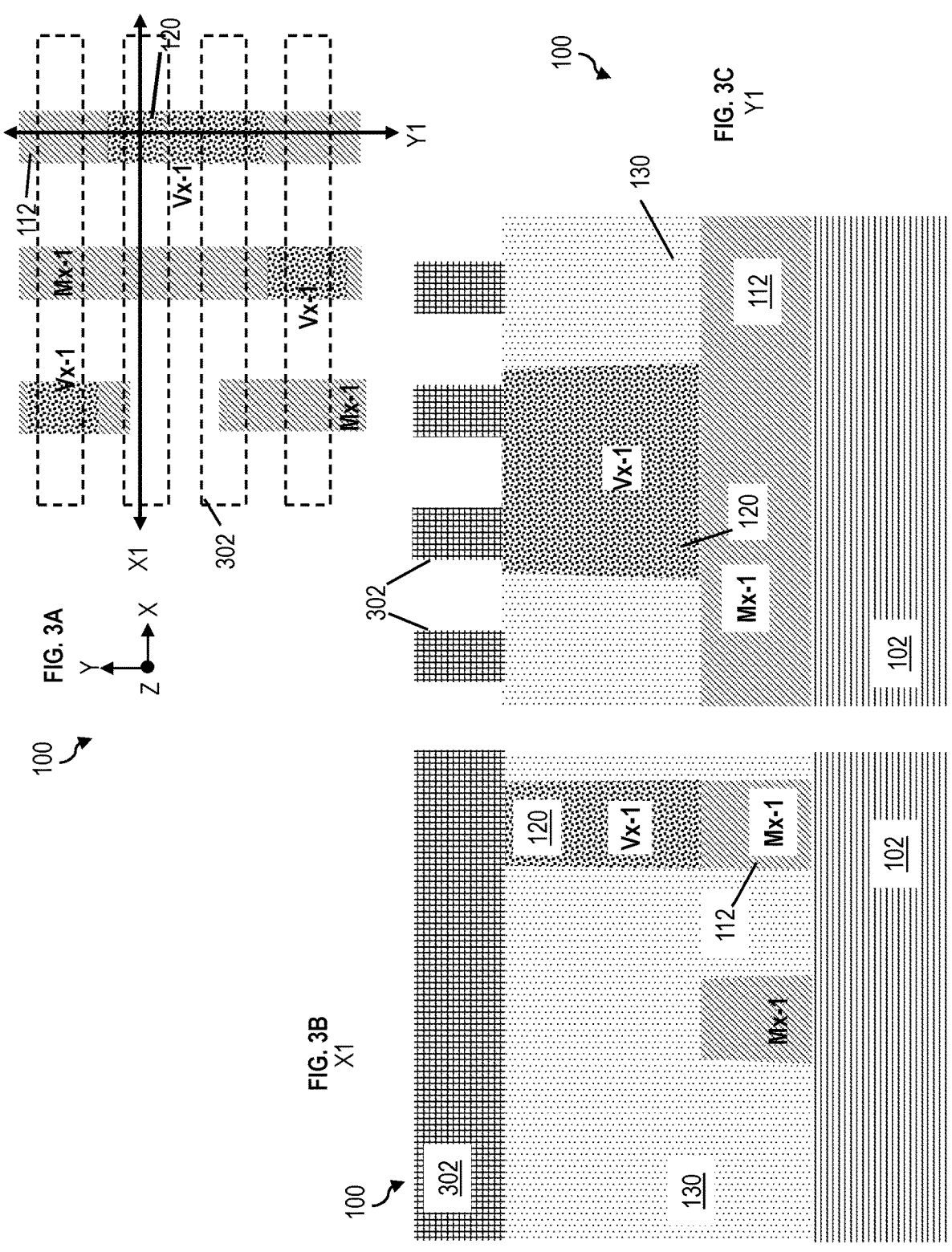
FIGS. 3A, 3B, and 3C respectively depict a top view and cross-sectional views of a portion of an IC under-fabrication after fabrication operations according to one or more embodiments of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments of the invention describe methods and subsequent device/structures which provide an interconnect with two-dimensional free zero line end enclosure. One or more embodiments provide tip-to-tip connect with zero track slip for connecting a metal layer line underneath to a metal layer line above connected together by a metal via. Having zero track skip at the metal layer line above enables block area scaling for improving the number of pins. Particularly, having a two-dimensional free zero line extension allows a metal line beneath and a metal line above to have no extension beyond the edges of the connecting metal via in two dimensions, thereby forming an interconnect with an L-shaped layout as discussed herein.

Turning now to a more detailed description of aspects of the present invention, FIG. 1A depicts a top view of a simplified illustration of a portion of an integrated circuit (IC) 100, FIG. 1B depicts a cross-sectional view taken along X1 of the IC 100, and FIG. 1C depicts a cross-sectional view taken along Y1 of the IC 100.

FIG. 1A illustrates upper metal lines Mx having a lengthwise direction in the x-axis and lower metal lines Mx-1 having a lengthwise direction in the y-axis, perpendicular to the metal lines Mx. Mx represents metal lines at metal level x, while Mx-1 represents metal lines at a metal level x-1. As such, Mx is one metal level above Mx-1. Although two metal levels are illustrated using Mx and Mx-1, it should be appreciated that the IC 100 can have more than two metal levels. Vx-1 represents metal vias connecting a metal line Mx above to a metal line Mx-1 below. The metal levels are metallization layers. Common metals that are used to form the metallization layers and interconnects are copper, cobalt, tungsten, gold, and aluminum.

Typically, two metal lines that are to be connected by a via require the two metal lines to have edges that extend beyond/over the intersection at the via in order to ensure that the via always makes a robust connection between the two metal lines, even with an overlay error. One or more embodiments can have zero extension of one or more metal line edges at the location of the metal via Vx-1, which is where the metal line Mx intersects the metal line Mx-1 through the metal via Vx-1. FIG. 1A illustrates an interconnect with zero extension in one-dimension at location 150 and an interconnect with zero extension in an L-shaped two-dimension at location 152.

As seen at location 150 in FIG. 1A, the metal line Mx-1 is formed below metal line Mx, where metal line Mx does not extend beyond the left edge of metal line Mx-1 in the x-axis but the metal line Mx-1 extends beyond another edge of the metal via Vx-1 in the y-axis. Thus, this illustrates an example interconnect with one-dimensional zero extension. It can also be seen that the metal line Mx does not extend beyond an edge of the metal line Mx-1 in the x-axis. The interconnect or interconnect structure is formed at location 150 by the connection of the metal line Mx, the metal via Vx-1, and the metal line Mx-1.

As seen at location 152 in FIGS. 1A, 1B, 1C, the Mx-1 metal line 112 is formed below the Mx metal line 110, where the Mx metal line 110 does not extend beyond one edge of the Vx-1 metal via 120 in the x-axis and where the Mx-1 metal line 112 does not extend beyond (and/or is substantially parallel to) another edge of the Vx-1 metal via 120. Thus, this illustrates the L-shaped two-dimensional zero extension. Moreover, two edges of the Vx-1 metal via 120 at the interconnect location 152 are free from additional metal material (that would typically be required by the Mx metal line 110 and Mx-1 metal line 112) in the x-axis and y-axis, thereby allowing a denser placement of elements. Similarly, the Mx metal line 110 does not extend beyond an edge of the Mx-1 metal line 112 in the x-axis in order for the interconnect to be formed. The interconnect or interconnect structure is formed at location 152 by the connection of Mx metal line 110, the Vx-1 metal via 120, and the Mx-1 metal line 112. Other interconnects are also seen in FIGS. 1A and 1B.

As seen in FIG. 1B, Mx metal line 110 abuts and/or is in direct contact with the side of Vx-1 via 120, without requiring the Mx metal line 110 to extend beyond the intersection, beyond two edges of the Vx-1 via 120, and/or beyond two edges of the Mx-1 metal line 112. Analogously, Mx-1 metal line 112 is in direct contact with the bottom of Vx-1 via 120, without requiring the Mx-1 metal line 112 to extend beyond the intersection, beyond two edges of the Vx-1 via 120, and/or beyond two edges of the Mx metal line 110. In one or more embodiments, a metal liner 114 may be formed between an interlayer dielectric (ILD) material 130 and the Mx metal line 110. Also, the metal liner 114 may be formed between the Mx metal line 110 and the Vx-1 metal via 120. In one or more embodiments, the metal of metal line Mx and the metal liner 114 together may be considered the Mx metal line 110. One or more portions of the metal lines Mx and Mx-1 can have metal liners. Particularly, metal lines formed of copper may utilize a barrier layer or barrier material. Example materials of the metal liner 114 may include cobalt, ruthenium, tantalum, tantalum nitride, indium oxide, titanium nitride, etc. Layer 102 represents various devices, such as transistors, capacitors, resistors, etc., and interconnects.

As recognized by one of ordinary skill in the art, the one-dimensional zero extension and the L-shaped two-dimensional zero extension provide techniques and structures for reducing the amount of real estate or space used to form interconnects on the IC 100, thereby allowing more devices to be formed at tighter pitches/spaces which can be more closely connected according to one or more embodiments. Unlike typical metal lines connected by a via, one or more embodiments illustrate that the metal line Mx and metal line Mx-1 do not have to intersect or crossover one another and then further extend a predetermined distance beyond the intersection.

FIGS. 2A, 2B, 2C through FIGS. 12A, 12B, 12C depict the IC 100 after selected fabrication operations have been completed for forming an interconnect with two-dimensional free zero line end enclosure according to one or more embodiments of the invention. Standard semiconductor fabrication techniques can be utilized to fabricate IC 100 as understood by one of ordinary skill in the art. Any suitable lithography processes including deposition techniques and etching techniques can be utilized herein.

FIGS. 2A, 2B, and 2C depict a top view and cross-sectional views of a portion of the IC 100 after fabrication operations according to one or more embodiments of the invention. FIGS. 2A, 2B, and 2C illustrate the IC 100 after formation of metal lines Mx-1 and metal vias Vx-1. The metal lines Mx-1 and metal via Vx-1 may be formed using standard interconnect subtractive metal patterning. Although not shown, an unpatterned metal layer may be formed on top of the device/interconnect layer 102 in the ILD layer 130, and a patterned hardmask layer can be formed on top of the unpatterned metal layer. The metal layer can be patterned/etched according to the patterned hardmask layer. After that, a via protecting mask is used to further protect the metal vias Vx-1 that should be kept, and etching is performed to recess the metal lines Mx-1 that are exposed. Subsequently, the ILD layer 130 is deposited followed by chemical mechanical polishing/planarization (CMP) in which the remaining hardmask is removed during CMP. It should be appreciated that, although an example of forming the metal lines Mx-1 and metal vias Vx-1 was discussed, other methods of forming metal lines Mx-1 and metal vias Vx-1 may be utilized. Depending on the method of forming the metal lines Mx-1 and metal vias Vx-1, the same or different metals may be utilized for the metal line Mx-1 versus a metal via Vx-1.

As seen in FIG. 2C, the metal via Vx-1 has a relatively large dimension VY in the y-axis. The metal via Vx-1 is purposefully large, and the range of VY may depend on the desired size of the metal via Vx-1 in the y-axis after subsequent fabrication operations. In one example, the length of VY may range from about 25-60 nanometers (nm).

The ILD layer 130 may include low-k dielectric materials or ultralow-k dielectric materials. Low-k dielectric materials may generally include dielectric materials having a k value of about 3.9 or less, such as silicon dioxide. The ultralow-k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraetehoxysilane (TEOS).

FIGS. 3A, 3B, and 3C depict a top view and cross-sectional views of a portion of the IC 100 after fabrication operations according to one or more embodiments of the invention. A sacrificial hardmask 302 or hardmask stack is deposited and patterned on top of the ILD layer 130, metal lines Mx-1, and metal vias Vx-1. The hardmask 302 is patterned as dummy metal lines that extend lengthwise in the x-axis. As such, the dummy metal lines of the hardmask 302 are perpendicular to the metal lines Mx-1, as best seen in FIG. 3A. Dashed lines are utilized to represent the patterned hardmask 302 in FIG. 3A so as not to obscure the figure. Example materials of the hardmask 302 may include silicon dioxide, silicon nitride, silicon oxynitride, titanium nitride, etc. An example stack for the hardmask may include silicon-containing anti-reflective coating ARC (SiARC).

FIGS. 4A, 4B, and 4C depict a top view and cross-sectional views of the IC 100 portion of the IC 100 after fabrication operations according to one or more embodiments. By using the pattern of the dummy lines in the hardmask 302, etching is performed to self-align the metal vias Vx-1 to the lines of the hardmask 302, thereby self-aligning the metal vias Vx-1 to the subsequently formed metal lines Mx. Reactive ion etching (RIE) may be utilized. Etching may be performed to leave some footings 420 in which residual material of the metal vias Vx-1 remain to avoid damaging the metal line Mx-1 underneath.

FIGS. 5A, 5B, and 5C depict a top view and cross-sectional views of the IC 100 at a point in fabrication where several process operations have been performed. Lithography is performed in preparation for a self-aligned Mx-1 cut at the desired location(s). A mask 502 is deposited and patterned, such that there is an opening in the mask 502 at the desired location. The mask 502 may be an organic planarization layer (OPL). It is noted that the mask 502 is not illustrated in FIG. 5A so as not to obscure the figure.

FIGS. 6A, 6B, and 6C depict a top view and cross-sectional views of a portion of the IC 100 after fabrication operations according to one or more embodiments of the invention. A self-aligned Mx-1 cut is performed at the desired location. Etching is performed through the metal line Mx-1 using the opening of the hardmask 302 and the opening of the mask 502 as a pattern. The etching results in opening 602 through the metal line Mx-1, thereby splitting the metal line Mx-1 into Mx-1 metal line 112 and Mx-1 metal line 116. The cut edge of Mx-1 metal line 112 and cut edge of Mx-1 metal line 116 are substantially aligned/parallel to the cut edge of Vx-1 metal via 120 and the cut edge of Vx-1 metal via 122, respectively. The cut edges follow the same tapered line. In one or more embodiments, the cut edges of Mx-1 metal line 112, Mx-1 metal line 116, Vx-1 metal via 120, and Vx-1 metal via 122 may not have a tapered profile.

FIGS. 7A, 7B, and 7C depict a top view and cross-sectional views of a portion of the IC 100 after fabrication operations according to one or more embodiments of the invention. Mx hardmask cuts are performed by removing the sacrificial hardmask 302, along with the mask 704, at desired locations. After the Mx-1 cut resulting in the opening 602 described in FIGS. 6A, 6B, 6C, the mask 502 is removed by ash, followed by new mask layer 704 coating (e.g., OPL) and patterning. The pattern of the openings in the photoresist layer are utilized to etch openings in the mask 704 and into the hardmask 302. There can be various openings through the mask 704 and hardmask 302 over the metal vias Vx-1. An example opening 702 exposes a top surface of the Vx-1 metal via 120 as depicted in FIG. 7B. A part of the stack of the hardmask 302 and the mask 704 may cover a small portion of the Vx-1 metal via 120, and this is very robust in alignment, because it does not matter how much the overlap is, the edge placement error tolerance of the cut opening 702 into hardmask 302 is large (as long as some portion of hardmask 302 still overlap with metal via Vx-1).

Figures 8A, 8B, 8C:
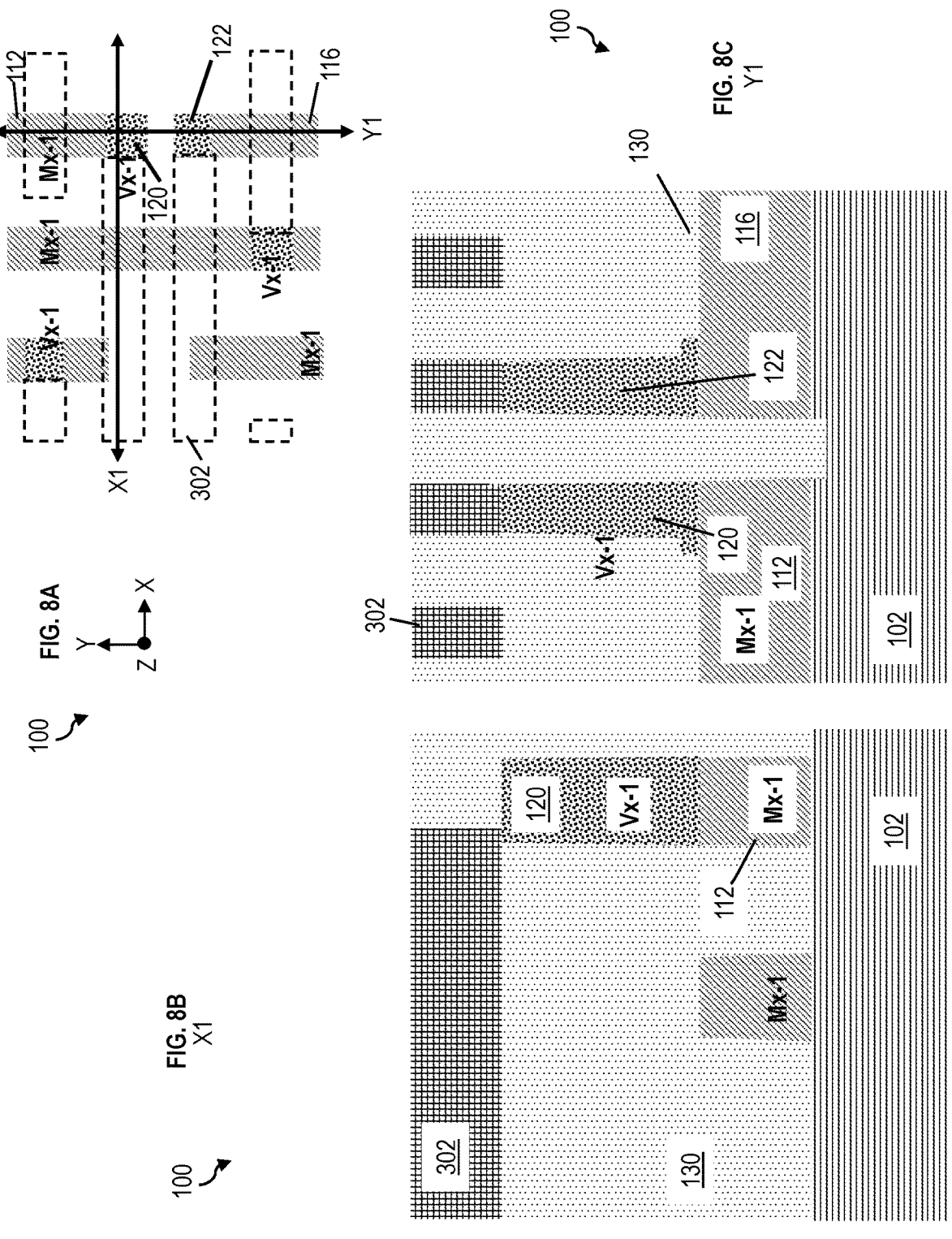
FIGS. 8A, 8B, and 8C respectively depict a top view and cross-sectional views of a portion of an IC under-fabrication after fabrication operations according to one or more embodiments of the invention.

FIGS. 8A, 8B, and 8C depict a top view and cross-sectional views of a portion of the IC 100 after fabrication operations according to one or more embodiments of the invention. The mask 704 is removed, and dielectric material is deposited resulting in further material of the ILD layer 130. Chemical mechanical planarization/polishing is performed. As seen in FIG. 8B, the previous opening 720 has been filled with material of the ILD layer 130.

FIGS. 9A, 9B, and 9C depict a top view and cross-sectional views of a portion of the IC 100 after fabrication operations according to one or more embodiments of the invention. Hardmask (ILD) capping is formed. The ILD layer 130 is recessed, and another hardmask capping material 902 is formed on the ILD layer 130. The ILD layer 130 may be etched using a wet or dry etch. The material of the hardmask capping material 902 is selected to have different etch characteristics than the hardmask 302. The hardmask capping material 902 is different from the material of the hardmask 302 to later allow the hardmask 302 to be selectively removed without removing the hardmask capping material 902. Example materials of the hardmask capping material 902 may include $AlO_x$, $TiO_x$, $TiN_x$, $AlN_x$, etc.

FIGS. 10A, 10B, and 10C depict a top view and cross-sectional views of a portion of the IC 100 after fabrication operations according to one or more embodiments of the invention. Selective removal of the sacrificial hardmask 302 is performed. The hardmask 302 may be etched using a plasma dry etch or wet etch. After etching the hardmask 302, cavities remain exposing portions of the metal vias Vx-1.

Figures 11A, 11B, 11C:
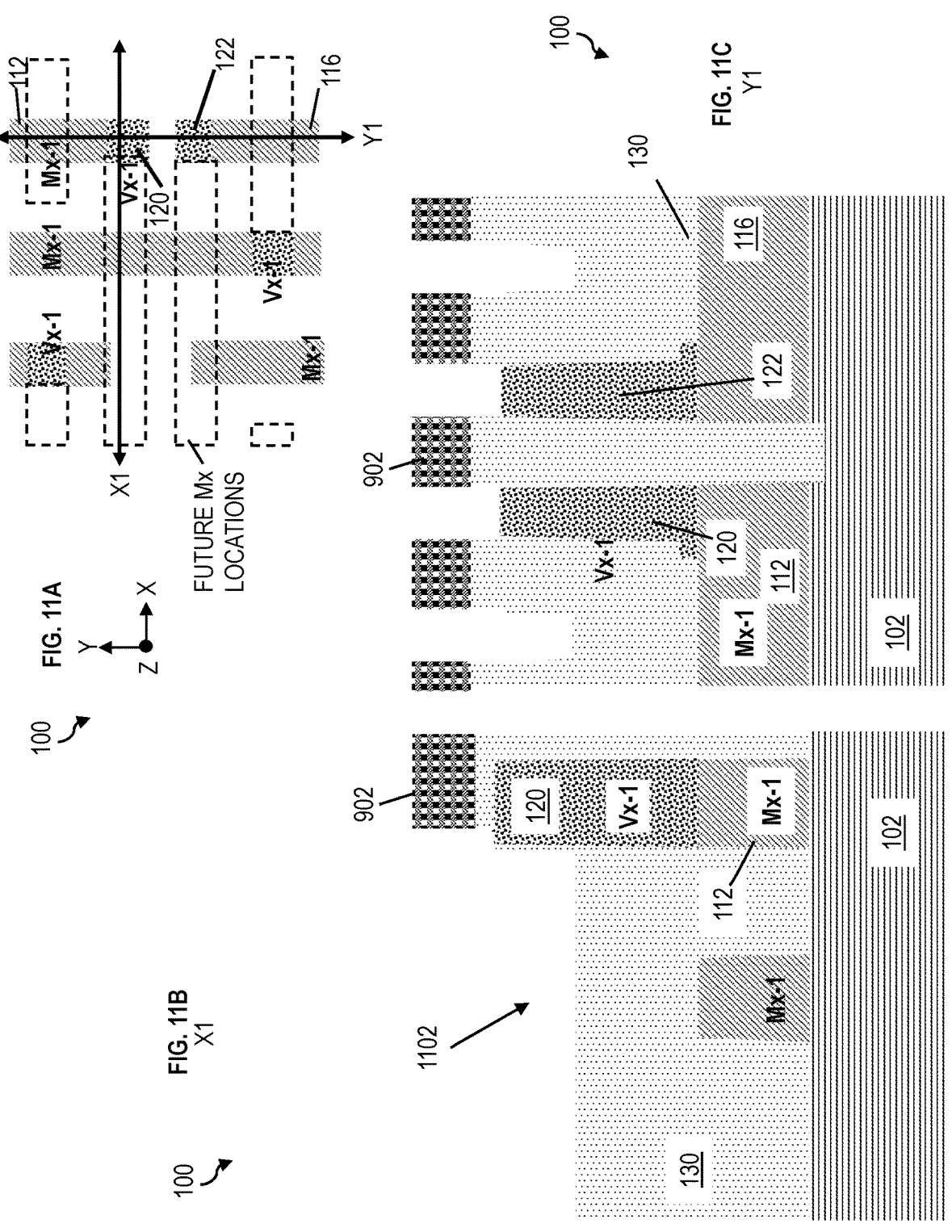
FIGS. 11A, 11B, and 11C respectively depict a top view and cross-sectional views of a portion of an IC under-fabrication after fabrication operations according to one or more embodiments of the invention.

FIGS. 11A, 11B, and 11C depict a top view and cross-sectional views of a portion of the IC 100 after fabrication operations according to one or more embodiments of the invention. Self-aligned metal layer Mx trench patterning is performed. Portions of the ILD layer 130 are removed, which are not protected by the hardmask capping material 902, to form self-aligned Mx metal layer trenches. For example, metal layer trench 1102 is formed in the ILD layer 130 to expose parts of Vx-1 metal via 120. A RIE etch may be utilized. Further, it is noted that etch damage to the metal vias Vx-1 is fine because any damaged portion will be refilled later.

Figures 12A, 12B, 12C:
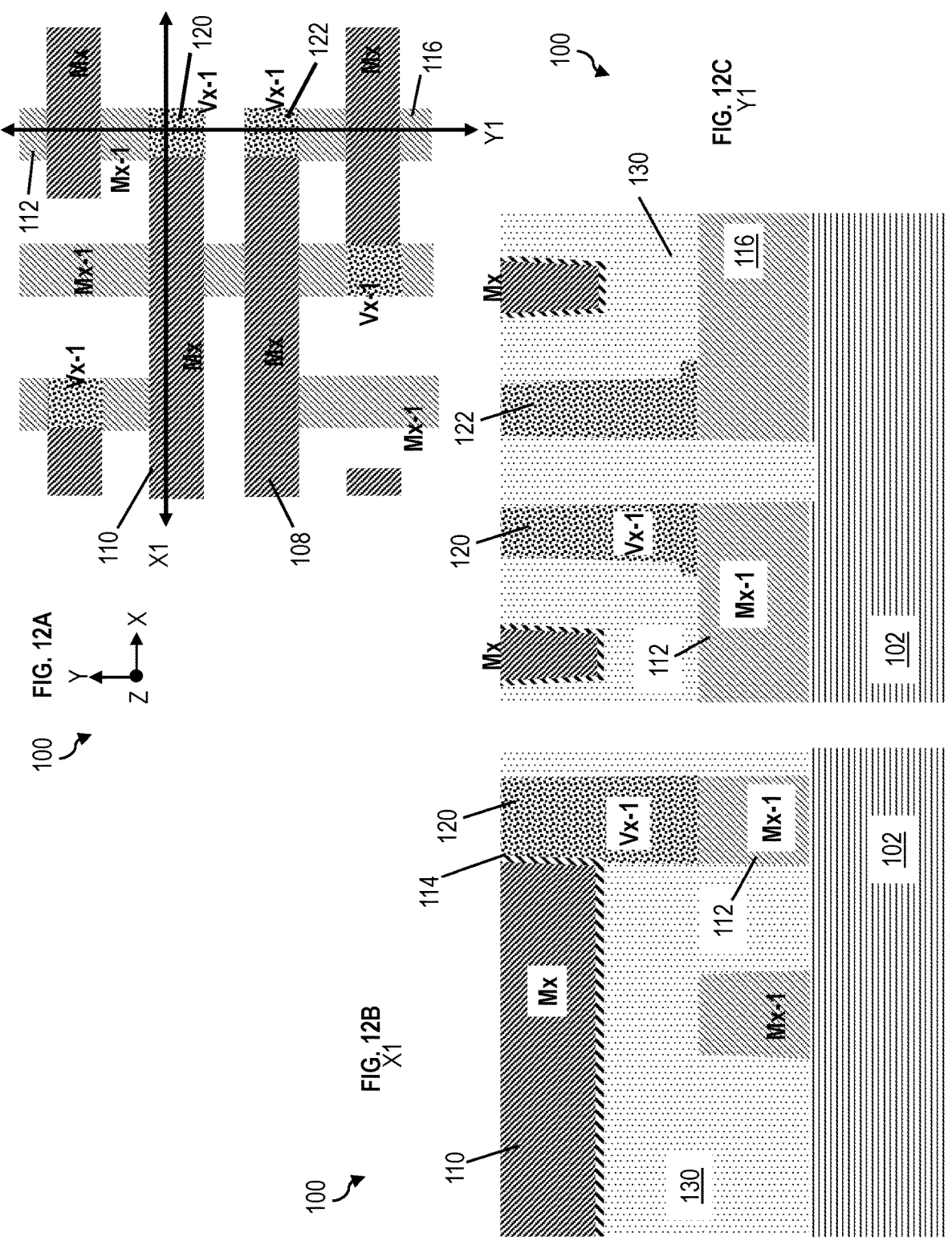
FIGS. 12A, 12B, and 12C respectively depict a top view and cross-sectional views of a portion of an IC under-fabrication after fabrication operations according to one or more embodiments of the invention.

FIGS. 12A, 12B, and 12C depict a top view and cross-sectional views of a portion of the IC 100 after fabrication operations according to one or more embodiments of the invention. A final Mx metallization is performed. In one or more embodiments, the metal liner 114 may be deposited. Metallization is performed to deposit Mx metal into the Mx metal layer trenches 1102 in FIGS. 11B and 11C, thereby forming metal lines Mx. Particularly, Mx metal line 110 is formed in direct connection with Vx-1 metal via 120, thereby forming an L-shaped two-dimensional zero extension interconnect between Mx-1 metal line 112, Vx-1 metal via 120, and Mx metal line 110. FIG. 12A shows that another L-shaped two-dimensional zero extension interconnect is formed between Mx-1 metal line 116, Vx-1 metal via 122, and Mx metal line 108. Respective one-dimensional zero extension interconnects are formed between metal line Mx-1, metal via Vx-1, and metal line Mx. Although two L-shaped two-dimensional zero extension interconnects and two one-dimensional zero extension interconnects are shown in FIG. 12A, more or fewer L-shaped two-dimensional zero extension interconnects and one-dimensional zero extension interconnects can be simultaneously formed according to one or more embodiments.

Figure 13:
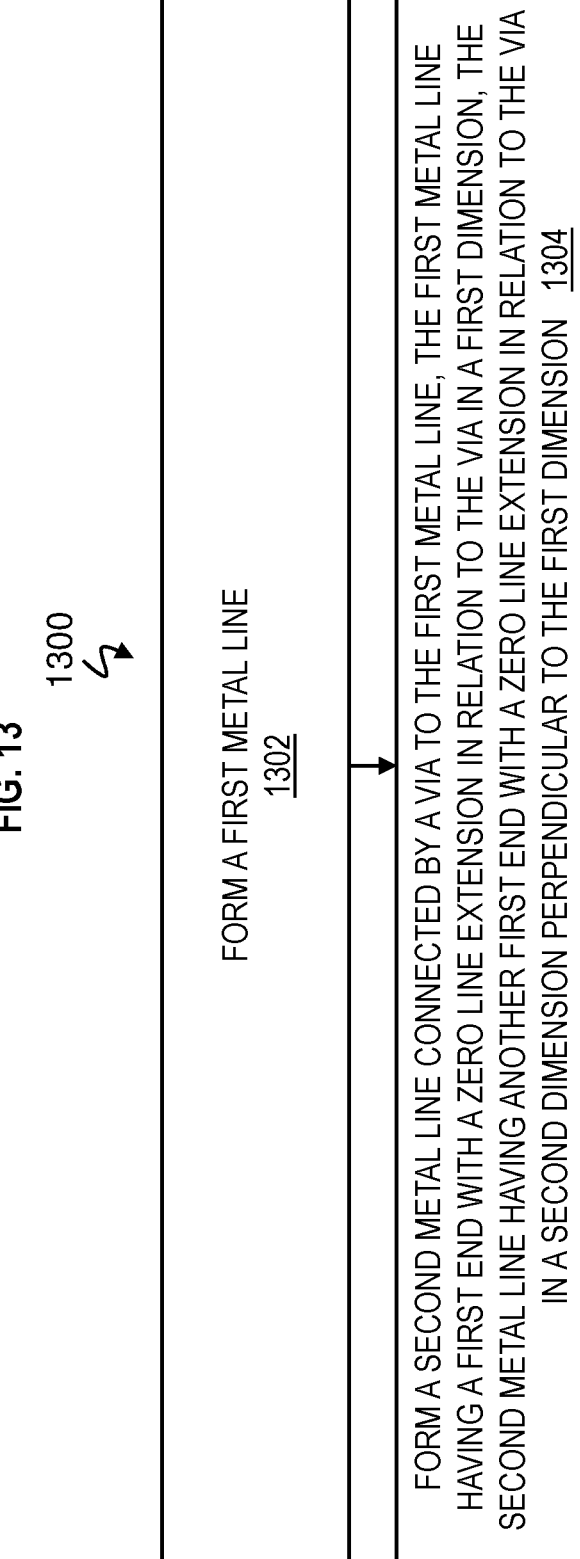
FIG. 13 is a flowchart of a computer-implemented method of forming interconnects with two-dimensional free zero line end enclosure according to one or more embodiments of the invention.

FIG. 13 is a flowchart of a computer-implemented method 1300 of forming one or more interconnect structures with two-dimensional free zero line end enclosure and/or interconnect structures with one-dimensional free zero line end enclosure according to one or more embodiments. Reference can be made to any of the figures discussed herein. At block 1302, the method 1300 includes forming a first metal line (e.g., Mx-1 metal line 112). At block 1304, the method 1300 includes forming a second metal line (e.g., Mx metal line 110) connected by a via (e.g., Vx-1 metal via 120) to the first metal line, the first metal line having a first end with a zero line extension in relation to the via in a first dimension, the second metal line having another first end with a zero line extension in relation to the via in a second dimension perpendicular to the first dimension.

The interconnect structure of claim 1, wherein the first metal line and the second metal line are formed adjacent to opposing ends of the via. For example, FIGS. 12A, 12B depict the Vx-1 metal via 120 connected at opposing ends to the Mx metal line 110 and Mx-1 metal line 112. The first metal line, the second metal line, and the via are connected to form an "L" shaped layout, as depicted in FIGS. 1A, 12A.

The first metal line comprises a positive tapered angle, the second metal line comprises a negative tapered angle; and the via comprises a positive tapered angle. In one or more embodiments, metal lines Mx-1 may be slightly wider at the bottom versus the top (i.e., positive tapered angle) in the x-axis, as depicted in FIG. 1B. In one or more embodiments, metal lines Mx may be slightly wider at the top versus the bottom (i.e., negative tapered angle) in the y-axis, as depicted in FIG. 1C.

The via (e.g., Vx-1 metal via 120) comprises a first edge and a second edge. An edge of the first metal line (e.g., Mx-1 metal line 112) is formed so as to avoid extending beyond the first edge of the via in the first dimension (e.g., x-axis), thereby having the first end with the zero line extension in relation to the via, as depicted (at location 152) in FIGS. 1A and 1B. An edge of the second metal line (e.g., Mx metal line 110) is formed so as to avoid extending beyond the second edge of the via in the second dimension (e.g., y-axis), thereby having the another first end with the zero line extension in relation to the via, as depicted in FIGS. 1A and 1C. For example, the cut edge of the Mx-1 metal line 112 is substantially parallel to the cut edge of the Vx-1 metal via 120 (at location 152) in FIGS. 1A, 1B, 6A, 6B.

The via (e.g., Vx-1 metal via 120) comprises a first edge and a second edge. An edge of the first metal line (e.g., Mx-1 metal line 112) is formed so as to avoid extending beyond the first edge of the via in the first dimension (e.g., x-axis), thereby having the first end with the zero line extension in relation to the via. Another edge of first metal line (e.g., Mx-1 metal line 112) formed so as to avoid extending beyond the second edge of the via in the second dimension (e.g., y-axis), thereby having a second end with a zero line extension in relation to the via.

The first metal line has a liner (not shown but analogous to metal liner 114) at a bottom, the second metal line having a liner (e.g., liner 114) at a bottom and sidewall. The via comprises a height dimension (e.g., in the z-axis) greater than the height dimension of the first metal line, the via comprises a height dimension (e.g., in the z-axis) greater than the height dimension of the second metal line.

A top surface of the via (e.g., Vx-1 metal via 120) is coplanar with a top surface of the second metal line (e.g., Mx metal line 110). The via comprises a footing 420 over a portion of the first metal line (e.g., Mx-1 metal line 112); and the via and the first metal line comprise a cut edge (e.g., formed by cut 602), the footing 420 being opposite the cut edge.

FIG. 14 is a flowchart of a computer-implemented method 1400 of forming one or more interconnect structures with two-dimensional free zero line end enclosure and/or one-dimensional free zero line end enclosure according to one or more embodiments. Reference can be made to any of the figures discussed herein.

At block 1402, the method 1400 includes forming a merged via (e.g., large/merged Vx-1 metal via 120 depicted in FIGS. 2A, 2B, 3A, 3B) over a bottom metal line (e.g., Mx-1 metal line 112) and forming top dummy lines (e.g., dummy lines as the patterned hardmask 302) at block 1404. At block 1406, the method 1400 includes etching portions of the merged via (e.g., large/merged Vx-1 metal via 120 depicted in FIGS. 2A, 2B, 3A, 3B) unprotected by the top dummy lines (e.g., dummy lines as patterned hardmask 302), resulting in self-aligned vias (e.g., Vx-1 metal vias 120, 122), the self-aligned vias being aligned to locations of the top dummy lines (e.g., dummy lines as the patterned hardmask 302). At block 1408, the method 1400 includes cutting the bottom metal line according to a spacing between the top dummy lines and removing the top dummy lines at block 1410. The method 1400 includes forming trenches (e.g., metal layer trenches 1102) adjacent to upper portions of the self-aligned vias at block 1412, the trenches being formed in dielectric material (e.g., ILD layer 130), and forming top metal lines (e.g., Mx metal lines 110) respectively in the trenches (e.g., metal layer trenches 1102) so as to be self-aligned to the self-aligned vias at block 1414.

The top metal lines (e.g., metal line Mx) are respectively adjacent to upper portions of the self-aligned vias (e.g., metal vias Vx-1).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An interconnect structure comprising:
a first metal line; and
a second metal line connected by a via to the first metal line, the first metal line having a first end with a zero line extension in relation to the via in a first dimension, the second metal line having another first end with another zero line extension in relation to the via in a second dimension perpendicular to the first dimension, wherein the first metal line comprises a positive tapered angle, the second metal line comprises a negative tapered angle, and the via comprises a positive tapered angle.

2. The interconnect structure of claim 1, wherein the first metal line and the second metal line are formed adjacent to opposing ends of the via.

3. The interconnect structure of claim 1, wherein the first metal line, the second metal line, and the via are connected to form an "L" shaped layout.

4. The interconnect structure of claim 1, wherein:

the via comprises a first edge and a second edge;

an edge of the first metal line is formed so as to avoid extending beyond the first edge of the via in the first dimension, thereby having the first end with the zero line extension in relation to the via; and an edge of the second metal line is formed so as to avoid extending beyond the second edge of the via in the second dimension, thereby having the another first end with the another zero line extension in relation to the via.

5. The interconnect structure of claim 1, wherein:

the via comprises a first edge and a second edge;

an edge of the first metal line is formed so as to avoid extending beyond the first edge of the via in the first dimension, thereby having the first end with the zero line extension in relation to the via; and another edge of the first metal line is formed so as to avoid extending beyond the second edge of the via in the second dimension, thereby having a second end with a further zero line extension in relation to the via.

6. The interconnect structure of claim 1, wherein the first metal line has a liner at a bottom, the second metal line having a liner at a bottom and a sidewall.

7. The interconnect structure of claim 1, wherein the via comprises a height dimension greater than the first metal line, the via comprising the height dimension greater than the second metal line.

8. The interconnect structure of claim 1, wherein a top surface of the via is coplanar with a top surface of the second metal line.

9. The interconnect structure of claim 1, wherein:

the via comprises a footing over a portion of the first metal line; and the via and the first metal line comprise a cut edge, the footing being opposite the cut edge.

10. A method comprising:

forming a first metal line; and forming a second metal line connected by a via to the first metal line, the first metal line having a first end with a zero line extension in relation to the via in a first dimension, the second metal line having another first end with another zero line extension in relation to the via in a second dimension perpendicular to the first dimension, wherein the first metal line comprises a positive tapered angle, the second metal line comprises a negative tapered angle, and the via comprises a positive tapered angle.

11. The method of claim 10, wherein the first metal line and the second metal line are formed adjacent to opposing ends of the via.

12. The method of claim 10, wherein the first metal line, the second metal line, and the via are connected to form an "L" shaped layout.

13. The method of claim 10, wherein:

the via comprises a first edge and a second edge;

an edge of the first metal line is formed so as to avoid extending beyond the first edge of the via in the first dimension, thereby having the first end with the zero line extension in relation to the via; and an edge of the second metal line is formed so as to avoid extending beyond the second edge of the via in the second dimension, thereby having the another first end with the another zero line extension in relation to the via.

14. The method of claim 10, wherein:

the via comprises a first edge and a second edge;

an edge of the first metal line is formed so as to avoid extending beyond the first edge of the via in the first dimension, thereby having the first end with the zero line extension in relation to the via; and another edge of the first metal line is formed so as to avoid extending beyond the second edge of the via in the second dimension, thereby having a second end with a further zero line extension in relation to the via.

15. The method of claim 10, wherein:

the first metal line has a liner at a bottom, the second metal line having a liner at a bottom and a sidewall;

the via comprises a height dimension greater than the first metal line, the via comprising the height dimension greater than the second metal line; and a top surface of the via is coplanar with a top surface of the second metal line.

16. The method of claim 10, wherein:

the via comprises a footing over a portion of the first metal line; and the via and the first metal line comprise a cut edge, the footing being opposite the cut edge.

17. A method comprising:

forming a merged via over a bottom metal line;

forming top dummy lines;

etching portions of the merged via unprotected by the top dummy lines resulting in self-aligned vias, the self-aligned vias being aligned to locations of the top dummy lines;

cutting the bottom metal line according to a spacing between the top dummy lines;

removing the top dummy lines;

forming trenches adjacent to upper portions of the self-aligned vias, the trenches being formed in dielectric material; and forming top metal lines respectively in the trenches so as to be self-aligned to the self-aligned vias.

18. The method of claim 17, wherein the top metal lines are respectively adjacent to upper portions of the self-aligned vias.

* * * * *